United States Patent [19]

Carlson

[11] Patent Number: 5,799,653

[45] Date of Patent: Sep. 1, 1998

[54] MAGNETIC RESONANCE IMAGING APPARATUS WITH DECREASED PATIENT CLAUSTROPHOBIA AND INCREASED ACCESS TO PATIENT

[75] Inventor: Joseph W. Carlson, Kensington, Calif.

[73] Assignee: Toshiba America MRI, Inc., Tustin, Calif.

[21] Appl. No.: 538,611

[22] Filed: Oct. 3, 1995

[51] Int. Cl.$^6$ ........................................................ A61B 5/05
[52] U.S. Cl. ...................... 128/653.2; 335/296; 335/297; 335/299; 324/318; 128/653.5
[58] Field of Search ........................... 128/653.1, 653.2, 128/653.5; 335/216, 296, 297, 299, 301; 324/309, 318, 319, 320

[56] References Cited

U.S. PATENT DOCUMENTS

| 4,534,358 | 8/1985 | Young . | |
|---|---|---|---|
| 4,710,716 | 12/1987 | Keren et al. | 324/309 |
| 4,812,796 | 3/1989 | Ries | 335/299 |
| 4,829,252 | 5/1989 | Kaufman . | |
| 4,985,678 | 1/1991 | Gangarosa et al. . | |
| 5,008,624 | 4/1991 | Yoshida . | |
| 5,305,749 | 4/1994 | Li et al. . | |
| 5,307,039 | 4/1994 | Chari et al. | 335/299 |
| 5,416,415 | 5/1995 | Dorri et al. . | |
| 5,448,214 | 9/1995 | Laskaris | 335/301 |

FOREIGN PATENT DOCUMENTS

| 2 275 538 | 8/1994 | United Kingdom . |
| 2 295 673 | 6/1996 | United Kingdom . |
| 2 299 673 | 10/1996 | United Kingdom . |

Primary Examiner—Marvin M. Lateef
Assistant Examiner—Eleni Mantis Mercader
Attorney, Agent, or Firm—Nixon & Vanderhye

[57] ABSTRACT

An economic and practical MRI magnet structure defines a patient imaging volume that permits greater access to the patient and reduces patient claustrophobia. The opening of the magnet structure is larger than a central region of the magnet. In one example embodiment, a tubular magnet structure flares out at one or both ends and may approximate a hyperboloid of revolution.

22 Claims, 4 Drawing Sheets

MAGNETIC RESONANCE IMAGING APPARATUS WITH DECREASED PATIENT CLAUSTROPHOBIA AND INCREASED ACCESS TO PATIENT

FIELD OF THE INVENTION

This invention relates to magnetic resonance imaging (MRI) utilizing nuclear magnetic resonance (NMR) phenomena. It is particularly directed to an MRI system utilizing a large polarizing magnet with one or both ends flared out to provide a larger opening at the end(s) of the magnet.

BACKGROUND OF THE INVENTION

MRI is now a well known technique for non-invasive imaging of patient tissue. Several types of MRI systems are commercially available. All of them require a large polarizing magnet to produce a very strong static magnetic field $H_o$ of an approximately homogenous nature within a pre-defined imaging volume. A programmed sequence of radio frequency pulses is transmitted into body portions located within the imaging volume at predetermined frequency distributions to selectively "nutate" the magnetic moment of certain atoms predetermined amounts in accordance with well known NMR principles. When the radio frequency pulses have been removed, the NMR nutated atoms tend to relax back into alignment with the magnetic moment of the static magnetic field $H_o$. In this relaxation process, characteristic NMR radio frequency signals are produced, detected, and processed to produce a desired MRI image of the body portion located within the imaging area (representing the spatial distribution of NMR nuclei within the image volume) by a number of well known procedures (e.g., via multiple Fourier transformation).

There are three types of magnets including resistive, superconducting, and permanent magnets as well as hybrid combinations. A presently popular MRI system design utilizes a cryogenic, solenoidal, superconducting electromagnet to create the static, polarizing magnetic field. In such a design, the magnet and its bore are cylindrical and of a sufficient length and diameter so that the whole body of a patient may be transported completely within the bore during imaging procedures. Unfortunately, the cylindrical bore leaves little or no access to the patient during preliminary preparation procedures or during final imaging procedures. Moreover, lying enclosed in this confined tunnel often provokes claustrophobia in patients, requiring the administration of sedatives to such patients in order for MRI procedures to be conducted. In fact, that restrictive shape of the magnet structure prevents most interventional procedures which attending medical personnel may wish to perform on the patient while in the imaging volume. Claustrophobia can be ameliorated by using a larger cylindrical magnet bore, but the cost of the magnet and other aspects of the MRI system, i.e., gradient coil, gradient amplifier, and RF transmitter, increase as does the length of the magnet, and acoustic noise. The weight of the magnet also increases further limiting where magnets can be sited, i.e., where there is adequate foundational support.

Another currently popular MRI system design utilizes electromagnets or permanent magnets in conjunction with substantially horizontal pole pieces that are disposed above and below the image volume. A return magnetic flux flows between the two poles by way of a plurality of vertical support members disposed at 90° intervals around the periphery of the poles (resembling a four-post bed). Another related MRI design option is to split a cylindrical superconducting magnet into two pieces along the longitudinal axis of the cylinder to provide access to the patient on either side of the cylinder.

These "open" MRI magnet structures provide for improved access to the patient and reduced patient claustrophobia, but at a high cost. Open or split magnet structures are considerably heavier than the conventional cylindrical magnet. Moreover, there are a number of technical difficulties which have not yet been adequately resolved associated with two large magnets so close to one another. For example, a suspension system is required to support both of the magnets, and if those magnets are to be superconducting magnets, separate cryogenic structures are required to cool both magnets and a satisfactory cryogenic bridge must be provided. With open MRI magnets suffering from much increased weight and complexity over cylindrical (but confining) MRI magnets, there is a need for an MRI magnet structure that is economic and practical which provides improved access to the patient and reduced patient claustrophobia.

SUMMARY OF THE INVENTION

The present invention solves these problems and meets current needs in the MRI field by providing an economic and practical MRI magnet structure that defines a patient imaging volume permitting improved access to the patient and reduced patient claustrophobia. Specifically, a tubular magnet structure houses a patient with a generally cylindrical shape that flares out at one or both ends thereby reducing patient claustrophobia and permitting physician access to the patient via one or both of the flared-out ends. As one example, the shape of the magnet structure approximates a hyperboloid of revolution referred to hereafter for purposes of brevity simply as a hyperboloid. The hyperboloid surface is defined by rotating a hyperbola about an axis (i.e., the z-axis) with the flared out ends of the hyperboloid defining a generally circular opening. Another example shape is a paraboloid of revolution. A specific geometric shape, however, is not required. Rather, the magnet may simply have a larger cross-sectional opening at one or both ends than the cross-sectional area of a central portion of the magnet.

As a result of this larger opening at the end(s) of the magnet structure, a physician or other medical personnel can more easily access the patient and administer anesthesia, intravenous fluids, remote probes, etc. The larger or flared out ends of the magnet also provide patients with the feeling of openness to reduce or eliminate claustrophobia. Both benefits are achieved without having to design and build special magnet suspension and gradient/RF coil designs for a split magnet structure. For superconductive magnets, a single cryogenic system similar to that used for conventional designs may be used to cool the MRI magnet according to the invention. As a result, the invention provides an improved MRI system from the standpoint of increased patient access and reduced patient claustrophobia without substantially increasing the cost of the MRI system.

A specifically-described example embodiment demonstrates how a substantially homogeneous magnetic field within the magnet enclosure/patient imaging volume may be achieved for a hyperboloid type magnet as an example of a magnet structure having a variable cross-section. In a hyperboloid-shaped electromagnet, greater current density must be produced at the flared out larger opening of the magnet than in the narrower central region of the magnet. Therefore, more current must flow through coils at the ends of the tubular magnet than in the center of the magnet. One way to accomplish this is by applying more coil turns per unit distance at the ends of the magnet than in the center.

These as well as other novel advantages and features of this invention will become more apparent upon careful study of the following detailed description of the exemplary embodiments of this invention in conjunction with the accompanying drawings.

DETAILED DESCRIPTION OF THE DRAWINGS

In the following description, for purposes of explanation and not limitation, specific details are set out such as particular structures and techniques in order to provide a thorough understanding of the present invention. However, it will be apparent to one skilled in the art that the present invention may be practiced in other embodiments that depart from these specific details. In other instances, detailed descriptions of well known methods, devices, structures, and circuits are omitted so as not to obscure the description of the present invention with unnecessary detail.

Figure 1:
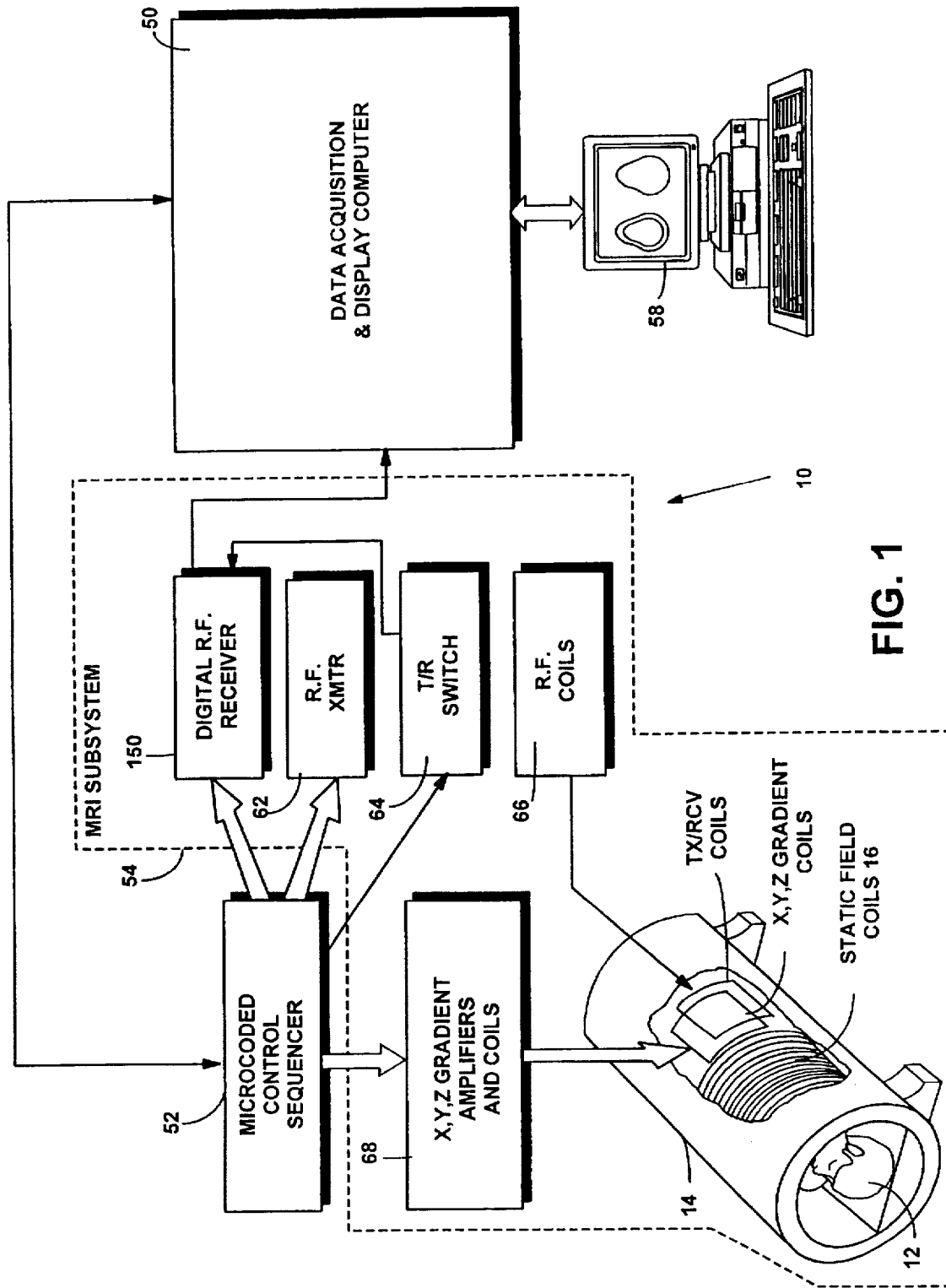
FIG. 1 is an overall schematic block diagram view of a magnetic resonance imaging system in which the present invention may be employed.

As background regarding the type of overall system incorporating the present invention, FIG. 1 is a schematic block diagram of an example magnetic resonance imaging ("MRI") system 10. MRI System 10 includes a computer 50, a sequencer 52, and an MRI subsystem 54. MRI subsystem 54 is controlled in real time by sequencer 52 to generate magnetic and radio frequency fields that stimulate nuclear magnetic resonance ("NMR") phenomena in an object (e.g., a human body 12) to be imaged. A resulting image of the object on display 58 may show features and structures that cannot be seen using X-ray, ultrasound, or other medical imaging techniques.

The basic techniques for magnetic resonance imaging are well known and therefore are only explained generally here. A patient is transported into a cylindrical, solenoid-type, cryogenic electromagnet assembly 14 which includes a shielded cylindrical bore around which is wound static electromagnetic field coils 16 and, typically, x, y and z magnetic gradient coils. Transmit/receive coils are also included within the assembly 14 to permit radio frequency NMR excitation signals to be transmitted to the object under test and NMR response signals to be received.

The static magnetic field produced by the static magnet 14 aligns the spin axes of rotating nuclei (e.g., hydrogen atom protons) within the object 12 to be imaged. An RF transmitter 62 generates a radio frequency (RF) pulse of a particular radio frequency (called the "Larmor frequency"). This RF pulse is connected by a "transmit/receive" ("T/R") switch 64 to RF coils 66 which apply corresponding RF (electro) magnetic fields to the object 12. The RF field temporarily stimulates the nuclei in the object 12, causing the axes of their spins to be realigned away from the direction of the static magnetic field. When the RF fields are switched off, "relaxation phenomena" cause the nuclei to return to their non or less stimulated states eventually becoming realigned with the static field. As the nuclei return to these non or less stimulated states, they generate their own RF magnetic fields which is the "NMR" signal.

The NMR signal "echo" induces a voltage in RF coils 66. An electronic RF digital receiver 150 (which is connected by the "T/R" switch 64 to the RF coils 66 between RF pulse transmissions) receives, amplifies, filters, and detects the induced voltage to provide a pair of time-varying output signals. The digital receiver 150 includes an analog-to-digital conversion arrangement that converts these output signals into a digital 2's complement representation. The digital receiver 150 samples the signal at fixed time intervals and outputs the sampled results as numerical digital data to the data acquisition and display computer 50. Sets or matrices of this numerical data so obtained are stored and analyzed by computer 50 which "reconstructs" (using complicated but conventional mathematical procedures) amplitude information corresponding to the concentration of nuclei within different volumes of the object. Such reconstructed amplitude information is used to generate a high quality image of the internal structure of the object 12, which can be displayed on a display screen 58, printed onto film for later viewing, etc.

In contrast to the restrictive cylindrical shape of the magnet assembly 14, the present invention employs a different shape where the opening(s) of the magnet assembly is (are) larger than the central/middle portion of the magnet assembly. For example, the magnet assembly may have a generally cylindrical shape that flares out at one or both ends. The larger flared out end reduces patient claustrophobia and permits access by a physician or other medical personnel to the patient. One example geometric surface is a hyperboloid of revolution (referred to simply as a hyperboloid). Although a hyperboloid type magnet is described below as one specific example, the present invention encompasses many other magnet shapes that, as described above, have a larger entrance than the cross-section of a center portion of the magnet. For magnets with circular cross-sections, this means that the radius of the circular cross-section increases (not necessarily in a linear or constant fashion) moving toward one or both ends of the enclosure.

An example hyperboloid-type magnet structure in accordance with the present invention will now be described in more detail below. A hyperboloid surface has been selected because hyperbolic geometry and hyperbolic functions can be used to mathematically describe this surface and demonstrate mathematically that a hyperboloid shaped magnet bore can be used to generate a static, substantially homogenous magnetic field within the hyperboloid bore. Again, those skilled in the art will clearly appreciate that the present invention is in no way limited to hyperboloid structures. Indeed, other geometric surfaces may be used as well as structures which are not readily defined by geometric or other mathematical functions.

Figure 2:
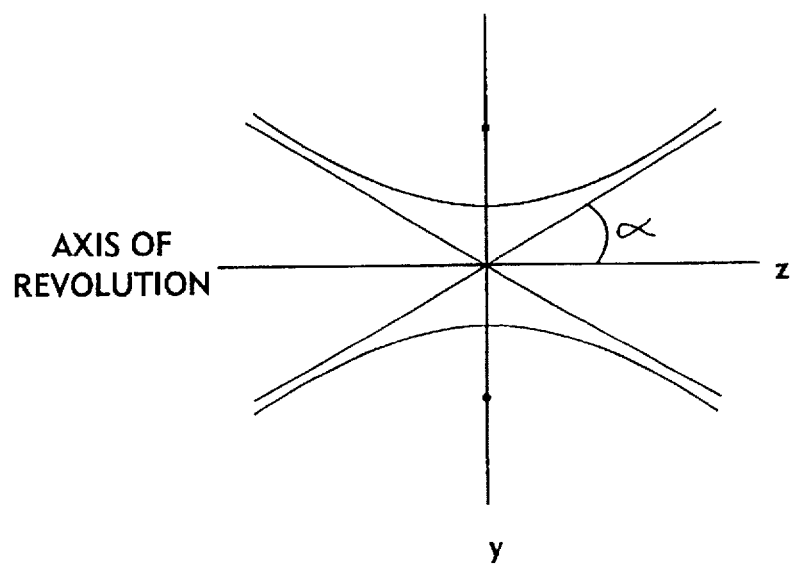
FIG. 2 illustrates a hyperbolic function and an axis of revolution about which the hyperbolis may be rotated to generate a hyperboloid of revolution.

FIG. 2 shows a hyperbola and an axis of revolution. As defined, a hyperboloid is a quadric surface generated by the hyperbola curves rotating about that axis of rotation. In addition, the use of the term "hyperboloid" as applied to a magnet structure for MRI systems refers to a hyperboloid bore or shell rather than a hyperboloid solid.

Figure 3:
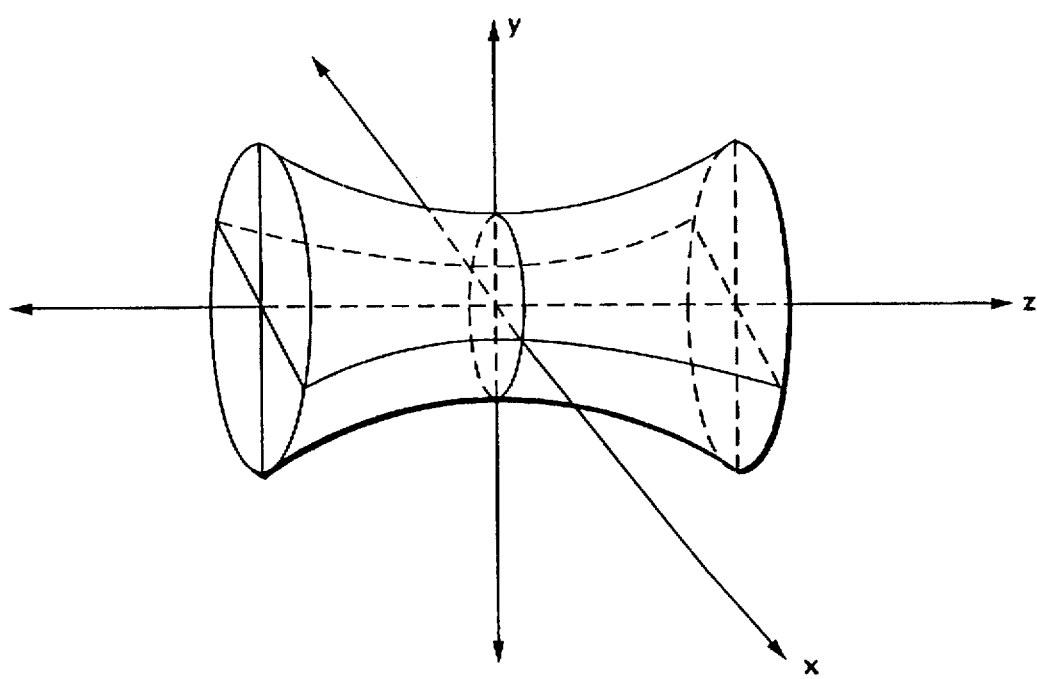
FIG. 3 is a graph showing a hyperboloid.

FIG. 3 illustrates a hyperboloid with respect to the three axes x, y, and z. Using a hyperboloid magnet, the current density generated at the surface of the hyperboloid must vary in order to provide a uniform magnetic field within the patient bore. At the flared-out openings of the hyperboloid, the radial distance from the longitudinal axis z is larger, and as a result, requires a greater current density than at the center of the hyperboloid (along the vertical axis of the coordinate system in FIG. 3) where the radial distance is smaller. Known mathematical techniques are described below to demonstrate that generation of a specifically varying current density along the surface of the hyperboloid magnet produces a uniform magnetic field along the z-axis within the magnet bore.

Figure 4:
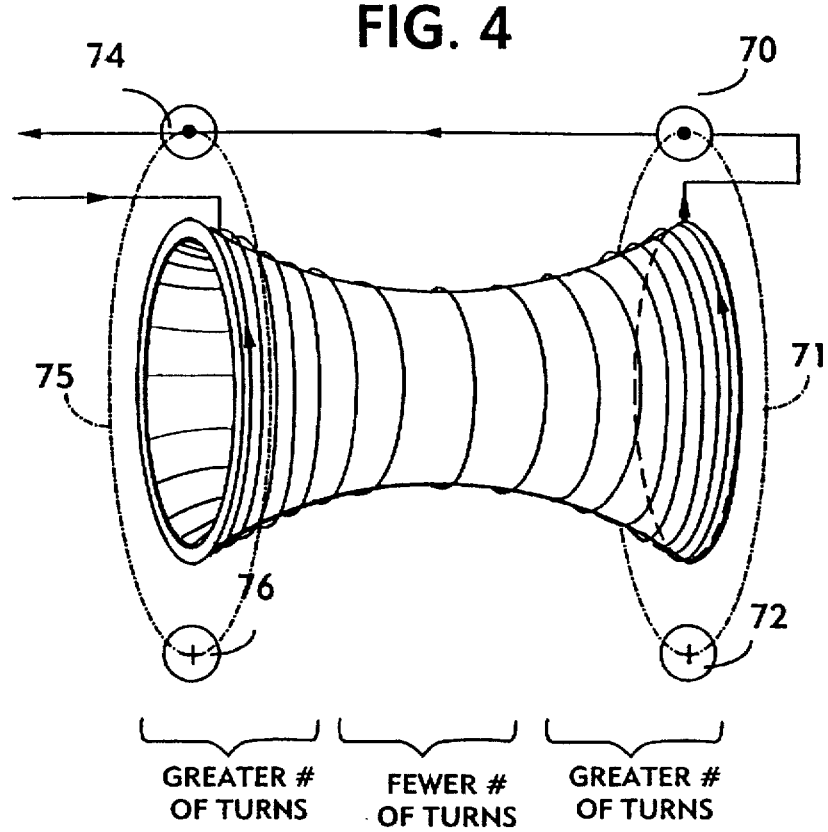
FIG. 4 is an example embodiment of an MRI static magnet shaped like a hyperboloid in accordance with an example embodiment of the present invention.

How this variable current density is generated for a solenoid-type electromagnet that uses multiple coil windings wrapped around a hyperboloid bore is now described in conjunction with FIG. 4. Of course, FIG. 4 is a high level drawing for illustration of the coil winding configuration at a conceptual level. A greater number of coil windings (i.e., turns) are wrapped around the bore at the flared-out ends of the hyperboloid, and a fewer number of coil windings are wrapped around the center of the hyperboloid bore. For example, windings on the order of 100 turns per mm may be used at the flared out opening of the bore, and windings on the order of 10 turns per mm may be used at the center of the bore. In this example, the more coil turns per unit distance along the hyperboloid bore, the more current density generated for that unit distance, and the more magnetic flux which is generated as a result. The underlying principle is that a greater magnetic flux distributed over a wider cross-sectional area produces the same magnetic field as a smaller magnetic flux distributed over a smaller cross-sectional area.

Figure 4A:
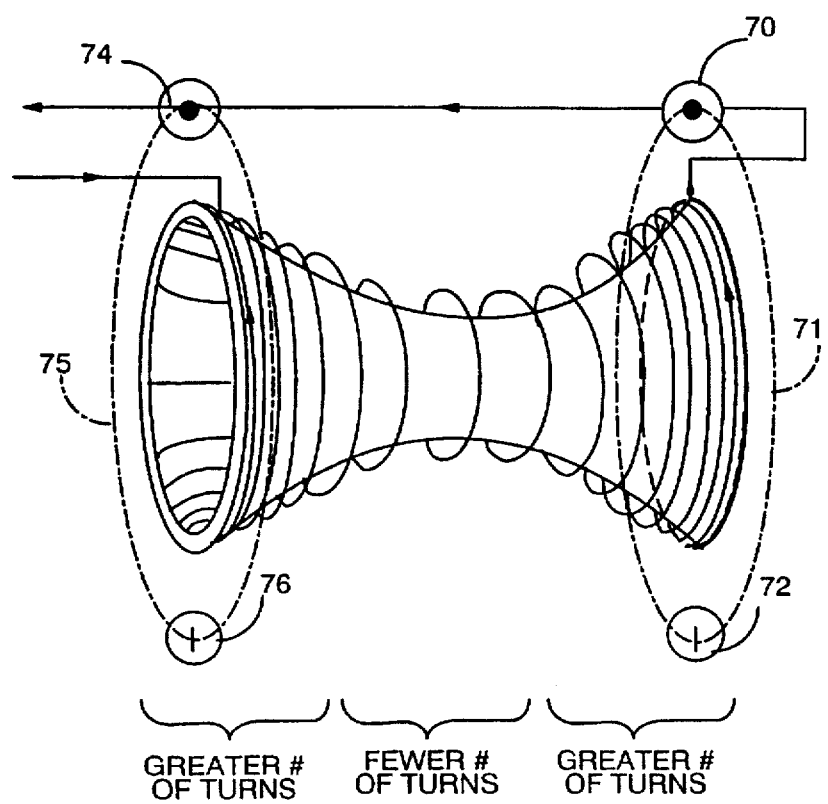
FIG. 4A is an example embodiment of an MRI magnet shaped as a paraboloid of revolution.
Figure 5:
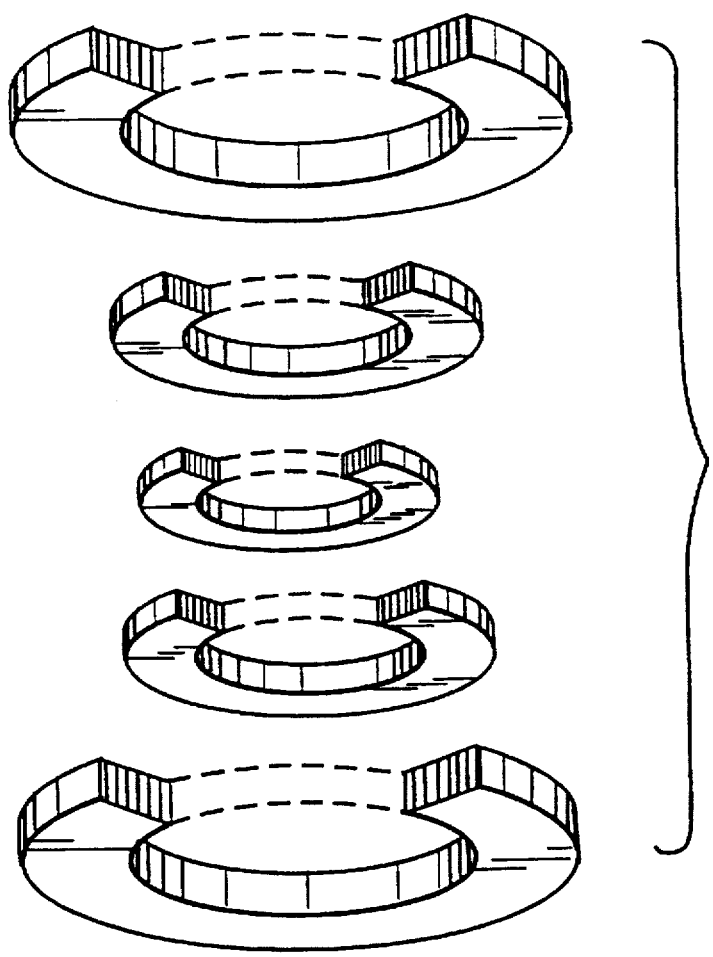
FIG. 5 illustrates another example embodiment of a hyperboloid-shaped MRI static magnet in accordance with the present invention.

FIG. 4A shows another embodiment where the magnet is shaped as a paraboloid of revolution. An alternative embodiment is illustrated in FIG. 5. Instead of continuous but variable pitch windings mounted on the hyperboloid bore, physically distinct but electrically connected coils are vertically mounted. Each coil is formed from insulated wires or ribbons (e.g., thin sheets) of conductive material circularly wrapped in a layered and/or stacked fashion. The number of conductive layers for the larger diameter coils at the ends of the magnet structure is greater than the number of conductive layers for the smaller diameter coils at the central region of the magnet assembly. As a result, the outer coils are thicker than the inner coils.

A preferred but optional embodiment of the present invention also employs a coil winding, active shielding structure. Shielding is necessary to minimize external fringe fields generated by the MRI magnet. As illustrated in FIG. 4, a secondary set of windings 71 and 75 shown using dashed-dotted lines are connected in series with the main coil windings wrapped around the hyperboloid bore. However, the secondary shield windings 71 and 75 are counterwound, i.e., they are configured in an orientation opposite from the direction the main windings are configured. Symbols 70 and 74 indicate a direction of current flow out of the page, and symbols 72 and 76 indicate current flow into the page. The current which flows through the main windings also flows through the secondary shield windings but in an opposite direction. As a result, the magnetic field generated by the secondary shield windings is of the same magnitude but opposite orientation of the magnetic field generated outside the hyperboloid bore by the current flowing through the main windings. For a proper choice of shielding coil size and number of turns, the magnetic dipole moments of the main and shielding windings cancel. As will be appreciated by those skilled in the art, the dominant component of the field outside the magnet is substantially cancelled.

By making the radius of the secondary shield windings larger than the main coil windings, fewer windings are required to effectively cancel the main winding moment. In other words, current flowing through a larger diameter coil generates a greater magnetic moment but less magnetic field at the center of the coil than it does flowing through a smaller coil. As will be appreciated by those skilled in the art, the external, magnetic dipole moments generated by the main and secondary sets of coil windings are not localized. Therefore, the total magnetic dipole moment can be cancelled without having the secondary shield windings wrapped around the entire length of the magnet bore. The location of the secondary shield windings 70–76 at the ends of the hyperboloid is preferable for purposes of minimizing their impact on the electromagnetic fields created at the central portion of the hyperboloid magnet which may house more sensitive portions of the object to be imaged, (e.g., a patient's head).

The hyperboloid magnet assembly described above can be designed using known mathematical techniques to ensure that an appropriate current density is generated along a particular part of the hyperboloid surface so as to produce a uniform magnetic field within the hyperboloid bore.

The surface of the hyperboloid can be described in terms of oblate elliptical coordinates. The usual Cartesian coordinates can be written in terms of new variables ($\alpha$ $\phi$ $\beta$), where $$x = c \cosh \beta \sin \alpha \cos \phi \qquad (1)$$

$$y = c \cosh \beta \sin \alpha \sin \phi \qquad (2)$$

$$z = c \sinh \beta \cos \alpha \qquad (3)$$

The parameter $\phi$ is the usual azimuthal angle. Surfaces of constant $\beta$ are oblate ellipses of revolution (i.e., the surface is an ellipse which is rotated around its short axis), and surfaces of constant $\alpha$ are hyperbolas of revolution. The parameter c is the distance from the origin to the focus of the hyperbolas. A finite length hyperboloid is described by $\alpha$=constant; $0<\phi<2\pi$; $-\beta_o<\beta<\beta_o$.

The expression for the magnetic field generated by a current density on the surface of this hyperbola is expressed in terms of the well known Legendre functions $P_v^\mu$. Two components of the Legendre functions are particularly useful—the symmetric and antisymmetric combinations:

$$C_v^\mu(x) = \frac{1}{2} (P_{-1/2}^\mu(x) + P_{-1/2}^\mu(-x)), \qquad (4)$$

$$S_v^\mu(x) = \frac{1}{2} (P_{-1/2}^\mu(-x) - P_{-1/2}^\mu(x)). \qquad (5)$$

The current density on the surface of the hyperbola may be described as a superposition of different C or S functions. This operation is analogous to the familiar superposition of sines or cosines common in Fourier decomposition of a function on a line interval. The sines would be chosen in the case of the expansion of an antisymmetric function over an interval; the cosines are for a symmetric function. In this case, the current density function is a symmetric function of the variable $\beta$, and therefore, the C functions are selected. As is known from the general theory of expansions of functions in a set of solutions of a Sturm-Liouville operator, the basis function needs to be selected so that either the basis functions or their derivatives vanish at the boundary, $\pm\beta_o$. The former condition is used generally. In order to satisfy this, the complex numbers, $\kappa_m$, must be calculated such that:

$$Re(C_1^{\kappa_m}(\tanh\beta_o))=0. \qquad (6)$$

The solutions of equation (6) give a discrete set of values for $\kappa_m$ which are purely imaginary. The particular form of the current density is $$j\phi = \sum_m \frac{\alpha_m \sqrt{\cosh\beta'}}{h_\beta \cdot h_\phi} C_1^{\kappa_m}(\tanh\beta'), \qquad (7)$$

with $h_\beta = c\sqrt{\sinh^2\beta + \cos^2\alpha}$, $h_\phi = c\cosh\beta\sin\alpha$.

In the case of an actively shielded magnet, a contribution for each term in the current density expansion to the current density is included which is a delta function distribution at the location (radius and longitudinal) of the shielding loop. The relative amplitude of the current in the shielding loop is fixed by the constraint that the magnetic dipole moment of the hyperbolic current equals the negative of the dipole moment of the pair of shielding loops.

The final calculation expresses the magnetic field generated by the current distribution. The field and all of its even derivatives with respect to z are calculated at the origin. For a current distribution designed to generate a homogenous field, the value of the field at the center of the magnet is specified and a certain number of derivatives of the field vanish. This procedure is well known in the art. The general expression for the derivative of the field produced by the current on the hyperbolic surface is $$\frac{\partial^{2n}}{\partial z^{2n}} B_z(\vec{r}=0) = \frac{\mu_0}{4\pi} \sum_m \int d\mu \frac{2\pi i\mu\Gamma^2\left(\mu+\frac{3}{2}\right)}{c^{2n+2}\cos\mu\pi} P^0_{\mu-1/2}(1) C_\mu^1(\cos\alpha) \times \frac{\left(\kappa_m - \frac{1}{2}\right) S_0^{\kappa_m}(\tanh\beta_o) C_1^\mu(\tanh\beta_o) - \left(\mu - \frac{1}{2}\right) C_1^{\kappa_m}(\tanh\beta_o) S_0^\mu(\tanh\beta_o)}{\mu^2 - \kappa_m^2} \times \left(\mu+\frac{3}{2}\right)\left(\mu+\frac{5}{2}\right)\ldots\left(\mu+2n+\frac{1}{2}\right) C^0_{2n+1}(0). \qquad (8)$$

$\Gamma$ is the gamma function. The integration is performed over the complex variable $\mu$ along a contour parallel to the imaginary $\mu$ axis which intercepts the real axis between $-0.5$ and $2.5$.

The implementation of the calculation follows from any of the known techniques for solving linear systems. A magnet may be designed with four vanishing derivatives by choosing 5 current modes and writing the linear equations for the value of the field at center (for example, 0.5 Telsa) and the four vanishing derivatives. Consequently, a set of 5 linear equations is solved to provide a unique solution for the 5 current mode amplitudes. Alternatively, we could select a larger number of current modes and minimize a quadratic function of the coefficients with the supplemental constraints of homogeneity imposed by the techniques of Lagrange multipliers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims. For example, it is preferred (but not essential) that the gradient and transmit/receive coils be positioned adjacent to and contoured to follow the interior surface of the magnet to further increase patient accessibility and decrease possible claustrophobic effects.

What is claimed is:

1. A magnetic system, comprising:
   a hollow, elongated magnet having a magnet bore with a first and second openings used in generating a magnetic field having a longitudinal axis extending through the center of the magnet and a substantially circular cross-section perpendicular to the longitudinal axis;
   wherein from a middle region of the magnet bore on the longitudinal axis, a radius of the substantially circular cross-section of the magnet bore increases towards the first and second openings of the magnet.

2. The magnetic system in claim 1, wherein the magnet is a hyperboloid of revolution.

3. The magnetic system in claim 1, wherein the magnet is a paraboloid of revolution.

4. A magnetic resonance imaging (MRI) system comprising an elongated magnet having a magnet bore with first and second openings forming an interior patient positioning volume, the patient positioning volume having a cross sectional area which is larger at the first and second openings than at a central portion of the magnet.

5. The MRI system in claim 4, further comprising:
   a configuration of main coil windings wrapped around the magnet such that when a current flows through the windings, a substantially homogeneous magnetic field is generated within the magnet.

6. The MRI system in claim 5, wherein the substantially homogeneous magnetic field is generated along a longitudinal axis running along center of the magnet.

7. The MRI system in claim in claim 6, wherein a number of main coil windings wound around the magnet per unit distance varies along the surface.

8. The MRI system in claim 7, wherein the number of main coil windings around at the central portion of the magnet is less than the number of main coil windings around an end of the magnet housing.

9. The MRI system in claim 5, further comprising:
   of secondary coil windings wound in an opposite direction from a direction in which the main coil windings are wound and connected in series with the main coil windings,
   wherein current flowing through the secondary coil windings generates a cancelling magnetic field that cancels a main magnetic field generated outside of the magnet by current flowing through the main coil windings.

10. A tubular magnet in a magnetic resonance imaging structure for housing a patient comprising a generally cylindrical shape where a cross-sectional area inside the tubular magnet as seen by the patient flares out at both ends of the magnet to reduce patient claustrophobia and permit physician access to the patient.

11. The tubular magnetic in claim 10, wherein the shape of the interior space inside the tubular magnet as seen by the patient approximates a hyperboloid.

12. A magnetic resonance imaging apparatus comprising:
   a tubular magnet including first and second openings and an interior patient positioning volume having a longitudinal axis along a length of the tubular magnet for producing a substantially uniform, static magnetic field within an imaging volume, a cross-sectional area of the interior, patient positioning volume at the first and second openings being larger than a cross-sectional area of a central portion the interior, patient positioning volume inside the tubular magnet;

magnetic gradient coils associated with the tubular magnet for effecting controlled gradients in the magnetic field within the patient imaging volume; and electronic circuitry for controlling the static magnetic field produced by the tubular magnet and the gradients produced by the gradient coils and processing resulting nuclear magnetic resonance signals to generate an image of an internal structure of an object placed within the imaging volume.

13. The magnetic resonance imaging apparatus in claim 12, wherein the magnetic gradient coils are positioned adjacent to an interior surface of the tubular magnet and are generally controlled to follow a shape of the magnet's interior, patient positioning volume.

14. The magnetic resonance imaging apparatus in claim 13, wherein the shape of the magnet's interior, patient positioning volume resembles a hyperboloid.

15. The magnetic resonance imaging apparatus in claim 12, wherein the tubular magnet includes main coil windings wrapped around a tubular coil winding support that flares out to the first and second openings of the magnet such that when a current flows through the windings, a substantially homogeneous magnetic field is generated within the patient imaging volume.

16. The magnetic resonance imaging apparatus in claim in claim 15, wherein a number of main coil windings per unit distance wound around the winding support varies along the length of the magnet.

17. The magnetic resonance imaging apparatus in claim 16, wherein the number of main coil windings around the central portion of the winding support is less than the number of main coil windings around a portion of the winding support at the magnet opening.

18. The magnetic resonance imaging apparatus in claim 15, further comprising:

secondary coil windings wound in an opposite direction from a direction in which the main coil windings are wound and connected in series with the main coil windings, wherein current flowing through the secondary coil windings generates a cancelling magnetic field that partially cancels a main magnetic field generated outside of the magnet by current flowing through the main coil windings.

19. The magnetic resonance imaging apparatus in claim 12, wherein the tubular magnet includes a configuration of multiple vertically-mounted, electrically-connected coils centered around and along the longitudinal axis, each coil being formed from insulated strips of conductive material wound in layered fashion into a circular ring, with the circular ring at the opening having a larger interior diameter than that of the circular ring at or near the central portion.

20. The magnetic resonance imaging apparatus in claim 19, wherein the circular ring at each first and second openings defines a cross-sectional open area greater than a cross-section open area defined by the circular ring at the central portion.

21. The magnetic resonance imaging apparatus in claim 12, wherein a substantially homogenous magnetic field is produced along the longitudinal axis within the imaging volume.

22. The magnetic resonance imaging apparatus in claim 12, wherein the tubular magnet is configured so that a larger magnetic field is produced at the larger first and second openings of the magnet than at the central portion of the magnet's interior patient positioning volume to produce a substantially homogenous magnetic field along the longitudinal axis within the imaging volume.

* * * * *